United States Patent
Kim et al.

(10) Patent No.: US 9,519,184 B2
(45) Date of Patent: Dec. 13, 2016

(54) BACKLIGHT UNIT

(71) Applicant: SAMSUNG ELECTRONICS CO., LTD., Suwon-si (KR)

(72) Inventors: Dae Yeon Kim, Suwon-si (KR); Young June Jeong, Seoul (KR); Hun Joo Hahm, Seongnam-si (KR); Jae Hong Shin, Suwon-si (KR); Chang Ho Shin, Incheon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 23 days.

(21) Appl. No.: 14/317,204

(22) Filed: Jun. 27, 2014

(65) Prior Publication Data

US 2014/0313696 A1    Oct. 23, 2014

Related U.S. Application Data

(60) Continuation of application No. 12/400,317, filed on Mar. 9, 2009, now Pat. No. 8,764,212, which is a
(Continued)

(30) Foreign Application Priority Data

Jul. 19, 2007   (KR) .................. 10-2007-0072266
Jul. 16, 2008   (KR) .................. 10-2008-0069033

(51) Int. Cl.
*G02F 1/13357*   (2006.01)
*G02F 1/1335*    (2006.01)
(Continued)

(52) U.S. Cl.
CPC .......... *G02F 1/133603* (2013.01); *F21K 9/50* (2013.01); *F21K 9/00* (2013.01);
(Continued)

(58) Field of Classification Search
CPC ................... G02F 1/133603; G02F 1/133609; G02F 2001/133614
See application file for complete search history.

(56) References Cited

U.S. PATENT DOCUMENTS 6,372,608 B1    4/2002   Shimoda et al.
6,645,830 B2   11/2003   Shimoda et al.
(Continued)

FOREIGN PATENT DOCUMENTS

CN    2795650 Y    7/2006
CN    2807292 Y    8/2006
(Continued)

OTHER PUBLICATIONS

Communication dated Sep. 8, 2014, issued by the Japanese Patent Office in counterpart Japanese Application No. 2011-262934.
(Continued)

*Primary Examiner* — Julie Bannan
(74) *Attorney, Agent, or Firm* — Sughrue Mion, PLLC

(57) ABSTRACT

Provided is a backlight unit including a plurality of light emitting diodes (LEDs) that emit light; a plurality of LED modules having a printed circuit board (PCB) which supports and drives the plurality of LEDs; a plurality of optical sheets that are attached to the top surfaces of the respective LED modules; and a plurality of heat radiating pads that are attached to the rear surfaces of the respective LED modules.

16 Claims, 7 Drawing Sheets

Related U.S. Application Data division of application No. 12/175,952, filed on Jul. 18, 2008, now Pat. No. 7,905,618.

(51) Int. Cl.
*F21K 99/00* (2016.01)
*H05K 1/14* (2006.01)

(52) U.S. Cl.
CPC ............ *G02F 2001/133614* (2013.01); *G02F 2001/133628* (2013.01); *H05K 1/142* (2013.01)

(56) References Cited

U.S. PATENT DOCUMENTS

| | | |
|---|---|---|
| 6,686,691 B1 | 2/2004 | Mueller et al. |
| RE38,466 E | 3/2004 | Inoue et al. |
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,125,137 B2 | 10/2006 | Kitajima et al. |
| 7,154,124 B2 | 12/2006 | Han et al. |
| 7,172,325 B2 | 2/2007 | Kim et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,467,877 B2 | 12/2008 | Peng et al. |
| 7,501,656 B2 | 3/2009 | Han et al. |
| 7,566,143 B2 | 7/2009 | Furukawa et al. |
| 7,568,826 B2 | 8/2009 | Hamada et al. |
| 7,648,254 B2 | 1/2010 | Yoo et al. |
| 7,682,850 B2 * | 3/2010 | Harbers ............ C09K 11/7774 257/98 |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,905,618 B2 | 3/2011 | Kim et al. |
| 7,940,350 B2 | 5/2011 | Jeong |
| 7,946,724 B2 | 5/2011 | Shin et al. |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim |
| 8,263,987 B2 | 9/2012 | Choi et al. |
| 8,324,646 B2 | 12/2012 | Lee et al. |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 2003/0228412 A1 | 12/2003 | Chen |
| 2004/0256974 A1 | 12/2004 | Mueller-Mach et al. |
| 2005/0012446 A1 | 1/2005 | Jermann et al. |
| 2005/0057929 A1 | 3/2005 | Yano et al. |
| 2006/0145123 A1 | 7/2006 | Li et al. |
| 2006/0146563 A1* | 7/2006 | Chen ................ G02F 1/133603 362/561 |
| 2006/0155397 A1 | 7/2006 | Focke et al. |
| 2006/0158090 A1 | 7/2006 | Wang et al. |
| 2006/0227554 A1 | 10/2006 | Yu |
| 2006/0244879 A1 | 11/2006 | Yoon et al. |
| 2007/0014098 A1 | 1/2007 | Park et al. |
| 2007/0035968 A1 | 2/2007 | Nakano |
| 2007/0070625 A1* | 3/2007 | Bang ................ G02F 1/133603 362/240 |
| 2007/0081355 A1* | 4/2007 | Lee ...................... G02B 6/0068 362/559 |
| 2007/0103908 A1 | 5/2007 | Tabito et al. |
| 2007/0147075 A1 | 6/2007 | Bang |
| 2007/0153515 A1* | 7/2007 | Hong ................ G02F 1/133603 362/237 |
| 2007/0189011 A1 | 8/2007 | Song et al. |
| 2007/0242459 A1 | 10/2007 | Nishigaki |
| 2007/0242477 A1* | 10/2007 | Yoo ..................... H05K 1/0206 362/612 |
| 2007/0258266 A1 | 11/2007 | Baek et al. |
| 2007/0263408 A1 | 11/2007 | Chua |
| 2008/0025019 A1 | 1/2008 | Kim |
| 2008/0116468 A1 | 5/2008 | Radkov et al. |
| 2008/0151143 A1* | 6/2008 | Li ..................... G02F 1/133603 349/68 |
| 2009/0032827 A1* | 2/2009 | Smits ................ G02F 1/133603 257/89 |
| 2009/0059579 A1* | 3/2009 | Shin ................. G02F 1/133603 362/231 |
| 2009/0072255 A1 | 3/2009 | Takahashi et al. |
| 2009/0140630 A1* | 6/2009 | Kijima ................ C09K 11/661 313/498 |

FOREIGN PATENT DOCUMENTS

| | | |
|---|---|---|
| CN | 1844984 A | 10/2006 |
| CN | 1854859 A | 11/2006 |
| CN | 1885576 A | 12/2006 |
| CN | 1920641 A | 2/2007 |
| EP | 1 717 633 A1 | 11/2006 |
| JP | 2001-184921 A | 7/2001 |
| JP | 2002-72901 A | 3/2002 |
| JP | 2003-507864 A | 2/2003 |
| JP | 2003-139712 A | 5/2003 |
| JP | 2003-535477 A | 11/2003 |
| JP | 2004-207688 A | 7/2004 |
| JP | 2004-288194 A | 10/2004 |
| JP | 2005-25628 A | 1/2005 |
| JP | 2005-100800 A | 4/2005 |
| JP | 2005303289 A | 10/2005 |
| JP | 2006-133721 A | 5/2006 |
| JP | 2006-189519 A | 7/2006 |
| JP | 2006-313684 A | 11/2006 |
| JP | 2006310319 A | 11/2006 |
| JP | 2006-344409 A | 12/2006 |
| JP | 2007048624 A | 2/2007 |
| JP | 2007-178988 A | 7/2007 |
| JP | 2007-180005 A | 7/2007 |
| JP | 2007-180021 A | 7/2007 |
| JP | 2007-183560 A | 7/2007 |
| WO | 01/14790 A1 | 3/2001 |
| WO | 2006/019016 A1 | 2/2006 |
| WO | 2006/049086 A1 | 5/2006 |
| WO | 2006104319 A1 | 10/2006 |
| WO | 2007/018260 A1 | 2/2007 |
| WO | 2007043211 A1 | 4/2007 |
| WO | 2007/063799 A1 | 6/2007 |

OTHER PUBLICATIONS

Communication, dated Nov. 20, 2009, issued by the State Intellectual Property Office of the People's Republic of China in counterpart Chinese Application No. 200810129908.7.

Communication from the Japanese Patent Office dated Mar. 1, 2011, in Application No. 2008-189122.

Communication from the Japanese Patent Office dated Mar. 1, 2011, in Application No. 2009-028704.

USPTO Office Action dated Jul. 21, 2011 in related U.S. Appl. No. 12/901,236.

Communication dated Oct. 19, 2011, issued by the State Intellectual Property Office of P.R. China in corresponding Chinese Patent Application No. 200910209695.3.

Communication dated Apr. 19, 2012 issued by the State Intellectual Property Office of P.R. China in counterpart Chinese Patent Application No. 200910209695.3.

(56) References Cited

OTHER PUBLICATIONS

Communication dated Jan. 29, 2013 from the State Intellectual Property Office of P.R. China in counterpart Chinese application No. 200910126042.9.
Communication dated Feb. 22, 2013 from the State Intellectual Property Office of P.R. China in counterpart Chinese application No. 200910209695.3.
Huh et al., "Optical Properties of Three-Band White Light Emitting Diodes", J. Electrochem. Soc., Feb. 16, 2003, vol. 150, Issue 2, pp. H57-H60.
Hirosaki et al., "Characterization and properties of green-emitting β-SiAlON:Eu2+ powder phosphors for white light-emitting diodes", Appl. Phys. Lett. 86, 211905, May 17, 2005, pp. 211905-1-211905-3.
Kodama et al., "Long-persistent Phosphorescence and Structural Characteristics of Eu2+- and Ce3+/Mn2+-doped Alkaline Earth Silicates", 207th ECS Meeting, Abstract #1335, May 17, 2005.
Li et al., "Low-Temperature Crystallization of Eu-Doped Red-Emitting CaAlSiN3 from Alloy-Derived Ammonometallates", Chem. Mater. 2007, 19, pp. 3592-3593, Jun. 5, 2007.
Communication dated Apr. 2, 2013 issued by the Japanese Patent Office in counterpart Japanese Patent Application No. 2011-262934.
Communication dated Aug. 20, 2013 issued by the State Intellectual Property Office of People's Republic of China in counterpart Chinese Application No. 200910209695.3.
Communication dated Aug. 28, 2013 issued by the Japanese Patent Office in counterpart Japanese Application No. 2011262934.
Communication dated Dec. 26, 2013 issued by the State Intellectual Property Office of the People's Republic of China in counterpart Chinese Patent Application No. 201210060356.5.
Communication dated Jul. 2, 2012 from the State Intellectual Property Office of P.R. China in a counterpart application No. 200910126042.9.
Communication from the State Intellectual Property Office of P.R. China dated Mar. 18, 2011, in Application No. 200910209695.3.
United States Office Action issued in U.S. Appl. No. 12/175,952 dated Oct. 21, 2009.
Communication dated Sep. 15, 2015 issued by the Japanese Patent Office in counterpart Japanese Patent Application No. 2011-262934.

\* cited by examiner

- Prior Art

BACKLIGHT UNIT

CROSS-REFERENCE TO RELATED APPLICATIONS

This application is a Continuation of U.S. application Ser. No. 12/400,317, filed Mar. 9, 2009, which is a Divisional of U.S. application Ser. No. 12/175,952, filed on Jul. 18, 2008 and issued on Mar. 15, 2011 as U.S. Pat. No. 7,905,618, which claims priority from Korean Patent Application Nos. 10-2007-0072266 and 10-2008-0069033 filed with the Korea Intellectual Property Office on Jul. 19, 2007 and Jul. 16, 2008, respectively, the disclosures of which are incorporated herein by reference.

BACKGROUND OF THE INVENTION

1. Field of the Invention

The present invention relates to a backlight unit which uses light emitting diode (LED) modules.

2. Description of the Related Art

Recently, with the rapid development of semiconductor technology, the performance of products is further enhanced while the size and weight thereof is reduced. Cathode ray tubes (CRT), which are still used for information display devices, have many advantages in terms of performance and price, but have a limit in miniaturization and portability. As a device for overcoming such a disadvantage, a liquid crystal display (LCD) device has been proposed. Since the LCD device can be reduced in size and weight and has low power consumption, the LCD device is being recognized as a substitute which can overcome the disadvantages of CRT. Currently, almost every information processing equipment requiring a display device includes the LCD device mounted thereon.

In the LCD device, a voltage is applied to a specific molecular arrangement of liquid crystal such that the molecular arrangement is converted into another molecular arrangement, and changes in optical characteristics of a liquid crystal cell, which emits light through the converted molecular arrangement, such as birefringence, rotatory power, two-color property, and diffusion, are converted into visual changes. That is, the LCD device is such a display device that uses the modulation of light by the liquid crystal cell.

Since the LCD device is a passive element which cannot emit light for itself, a backlight unit attached to the rear surface of a liquid crystal panel is used to illuminate the liquid crystal panel. The light transmittance of the liquid crystal panel is adjusted by an applied electrical signal, and still or moving images are displayed on the liquid crystal panel.

As for a lamp used in the backlight unit which supplies light to the liquid crystal panel, a cold cathode fluorescent lamp (CCFL) has been widely used. Recently, however, a backlight unit using LEDs are frequently used for a variety of display devices such as a portable device and a field sequential color LCD device.

Referring to FIG. 1, a conventional backlight unit using LEDs will be described in detail.

FIG. 1 is a perspective view of a conventional backlight unit.

As shown in FIG. 1, the conventional backlight unit is positioned under a display panel (not shown) and includes a plurality of LEDs 110, a plurality of LED modules 120 having a printed circuit board (PCB) which supports and drives the plurality of LEDs 110, an optical sheet 140 which is provided above the plurality of LED modules 120 so as to be spaced at a predetermined distance from the LED modules 120, and a heat radiating pad 130 which is provided on the rear surface of the LED modules 120.

The conventional backlight unit is constructed in such a manner that the optical sheet 140 disposed above the plurality of LED modules 120 is spaced at a predetermined distance from the LED modules 120, and one optical sheet 140 covers all the LED modules 120. In this case, the heat radiating pad 130 on the rear surface of the LED modules 180 may be divided in accordance with the number of LED modules 120 so as to be individually attached to each of the LED modules 120, or one heat radiating pad 130 may be attached so as to cover the overall LED modules 120.

However, when the optical sheet of the backlight unit is formed so as to be spaced from the LED modules, there are difficulties in achieving a reduction in size and thickness of a display device using the backlight unit.

Further, when the optical sheet for controlling light orientation is received and fixed as one sheet which covers the overall LED modules, the optical sheet above the LED modules should be entirely removed if any one of the LED modules is damaged. Therefore, a rework process of the backlight unit becomes complicated.

SUMMARY OF THE INVENTION

An advantage of the present invention is that it provides a backlight unit in which an LED module, an optical sheet positioned above the LED module, and a heat radiating pad positioned under the LED module are integrally formed, thereby reducing the size and thickness of the backlight unit.

Additional aspects and advantages of the present general inventive concept will be set forth in part in the description which follows and, in part, will be obvious from the description, or may be learned by practice of the general inventive concept.

According to an aspect of the invention, a backlight unit comprises a plurality of light emitting diodes (LEDs) that emit light; a plurality of LED modules having a printed circuit board (PCB) which supports and drives the plurality of LEDs; a plurality of optical sheets that are attached to the top surfaces of the respective LED modules; and a plurality of heat radiating pads that are attached to the rear surfaces of the respective LED modules.

The optical sheet, and the heat radiating pad may be formed to have the same size.

The optical sheet and the heat radiating pad may have a smaller size than the LED module.

The LED modules may be arranged in parallel to each other in the longitudinal direction thereof.

The LED modules may be arranged so as to surround a predetermined region.

The plurality of LEDs may be continuously arranged in a triangle or rectangle shape.

The plurality of LEDs may be separated for each block in a circuit manner such that some LEDs among the plurality of LEDs can be partially turned on/off.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which.

DETAILED DESCRIPTION OF THE PREFERRED EMBODIMENTS

Figure 1:
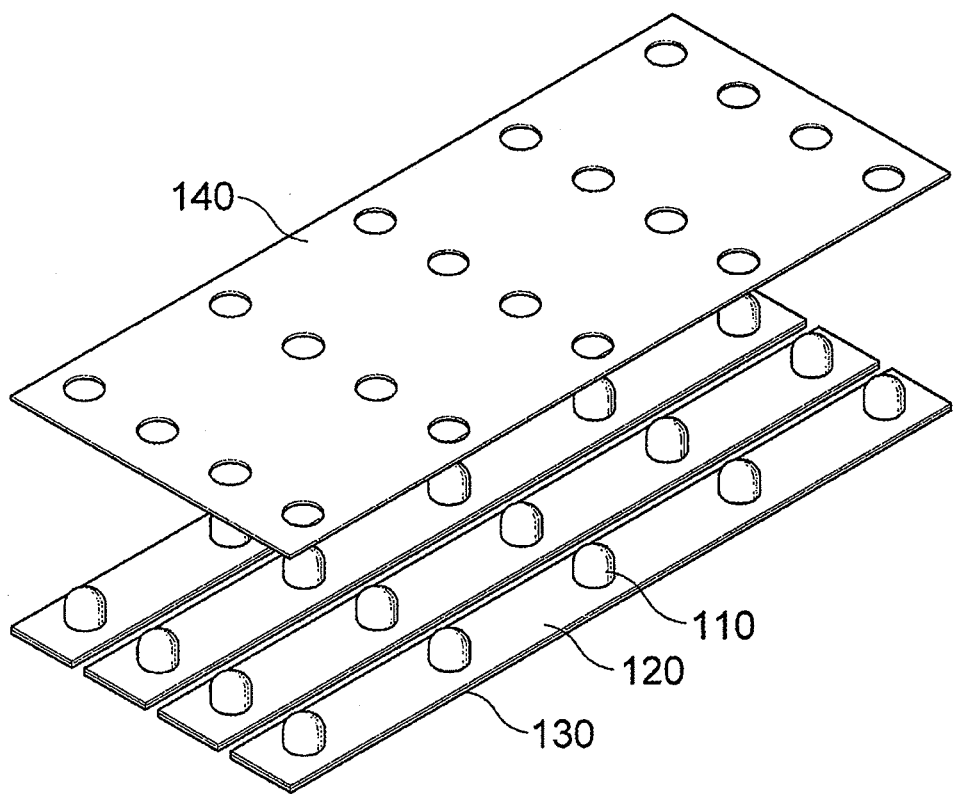
FIG. 1 is a perspective view of a conventional backlight unit.

Reference will now be made in detail to the embodiments of the present general inventive concept, examples of which are illustrated in the accompanying drawings, wherein like reference numerals refer to like elements throughout. The embodiments are described below in order to explain the present general inventive concept by referring to the figures.

Hereinafter, a backlight unit according to the present invention will be described in detail with reference to the accompanying drawings.

Figure 2A:
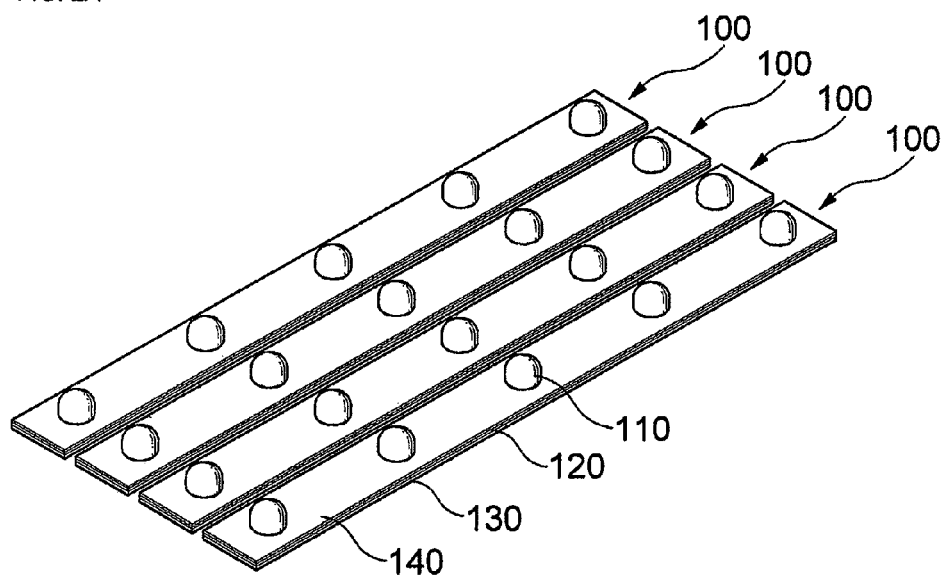
FIGS. 2A and 2B are perspective views of backlight units according to the invention.
Figure 2B:
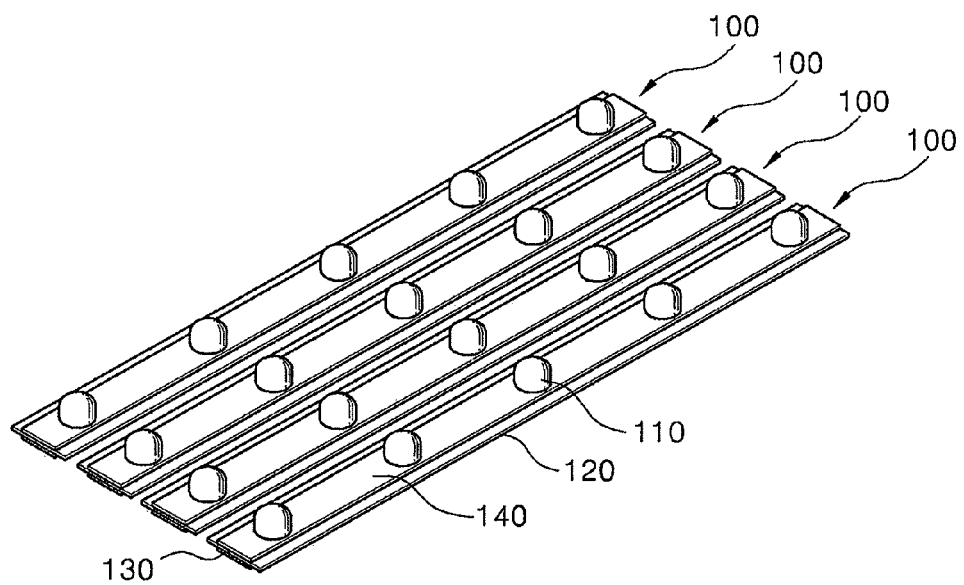

FIGS. 2A and 2B are perspective views of backlight units according to embodiments of the invention.

As shown in FIG. 2A, the backlight unit 100 according to the embodiment of the invention is positioned under a display device (not shown) and includes a plurality of LEDs 110 which emit light, a plurality of LED modules 120 having a printed circuit board (PCB) which supports and drives the plurality of LEDs 110, a plurality of optical sheets 140 which are attached to the top surfaces of the respective LED modules 120, and a plurality of heat radiating pads 130 which are attached to the rear surfaces of the respective LED modules 120.

The plurality of LEDs 110 can implement white light. For example, the plurality of LEDs 110 may include blue LED chips and red and green phosphors disposed on the blue LED chips. Alternately, the plurality of LEDs 110 may include blue LED chips, red LED chips, and green LED chips. In this case, the blue LED chips include LED chips having an emission wavelength of 250 to 420 nm and blue phosphors disposed on the LED chips. Further, the red and green LED chips include LED respectively include red and green phosphors disposed on LED chips having an emission wavelength of 250 to 420 nm.

As for a material used as the red phosphor, nitride-based $CaAlSiN_3:Eu$, sulfide-based $(Ca, Sr)S:Eu$ and so on may be exemplified.

As for a material used as the green phosphor, silicate-based $A_2SiO_4$ having a composition of 2, 1, 4, silicate-based $A_3SiO_5$ having a composition of 3, 1, 5, sulfide-based $SrGa_2S_4:Eu$, and nitride-based Beta-SiAlON may be exemplified. As for the silicate-based phosphor having a composition of 2, 1, 4, $(Sr, Ba, Ca, Mg)_2SiO_4:Eu, X$ may be used. In this case, Sr is an essential element, and Ba, Ca, and Mg may be selectively included (0≤sum of composition of Ba, Ca, Mg≤1), if necessary. Eu is used as an activator, and Eu2+ is used. X is an additive and may include at least one or more of Ho, Er, Ce, Y, F, Cl, Br, I, P, S, N, and Gd. A doping amount of X may be adjusted in the range of 1 to 500000 ppm. Further, as for the silicate-based phosphor having a composition of 3, 1, 5, $(Sr, Ba, C, Mg)_3SiO_5:Eu, X$ may be used. In this case, Sr is an essential element, and Ba, Ca, and Mg may be selectively included (0≤sum of composition of_Ba, Ca, Mg≤1), if necessary. Eu is used as an activator, and Eu2+ is used. X is an additive and may include at least one or more of Ho, Er, Ce, Y, F, Cl, Br, I, P, S, N, and Gd. A doping amount of X may be adjusted in the range of 1 to 500000 ppm.

As for a material used as the blue phosphor, a silicate-based material, a sulfide-based material, a nitride-based material, and an aluminate-based material may be exemplified.

The plurality of LED modules 120 include a plurality of LEDs 110 arranged in a matrix shape composed of m rows and n columns. In this case, the plurality of LEDs 110 arranged in a m×n matrix may be divided into a plurality of blocks. Here, m and n are positive numbers equal to or more than 2.

Each of the LED modules 120 includes a plurality of blocks. In this case, the plurality of LEDs 110 may be divided for each block so as to be separately driven.

As such, the backlight unit 100 can be divided and driven for each block.

Further, as any one of the number of LED modules, the number of blocks included in the LED module, and the number of LED chips for each block is properly adjusted, luminous intensity required for the backlight unit can be properly adjusted.

Specifically, the selection of the proper number of LEDs, the number of LED modules, the number of blocks for each LED module, and the number of LED chips for each block depending on the size of the backlight unit will be described.

In this embodiment, backlight units having a size of 40, 46, 52, and 57 inches, respectively, are exemplified.

First, the total luminous intensity (lumens) required for each backlight unit size may be set to 7000, 8000, 93000, and 13000. The number of LED chips which can satisfy the total luminous intensity can be determined depending on the luminous intensity of a unit LED, as shown in Table 1.

In general, 4, 8, 10, and 15 lumens LEDs are used. Table 1 shows the number of LEDs required for each backlight unit size.

TABLE 1

| Backlight unit size (inch) | | 40 | 46 | 52 | 57 |
| --- | --- | --- | --- | --- | --- |
| Total luminous intensity (lumens) | | 7000 | 8000 | 9300 | 13000 |
| Number of LEDs depending on luminous intensity of unit LED | 4 lumens LED | 1750 | 2000 | 2325 | 3250 |
| | 8 lumens LED | 875 | 1000 | 1162 | 1625 |
| | 10 lumens LED | 700 | 800 | 930 | 1300 |
| | 15 lumens LED | 466 | 533 | 622 | 866 |

As shown in Table 1, the number of LEDs required depending on the luminous intensity of the unit LED may slightly differ. Such a large number of LEDs need to be properly arranged in consideration of color uniformity and brightness, so as to have optical density.

To easily implement the arrangement for the area and number, the number of LED modules, the number of blocks for each module, and the number of LEDs for each block are properly selected so as to obtain optimal brightness and color uniformity.

To satisfy the condition shown in Table 1, the number of LED modules, the number of blocks for each module, and the number of LEDs for each block in each backlight unit size may be selected as shown in Table 2.

TABLE 2

| Backlight unit size (inch) | 40 | 46 | 52 | 57 |
| --- | --- | --- | --- | --- |
| Number of LEDs | 466-1750 | 533-2000 | 622-2325 | 866-3250 |
| Number of LED modules | 6-12 | 6-12 | 6-12 | 6-20 |
| Number of blocks for each module | 4-14 | 5-15 | 6-28 | 6-28 |
| Number of LEDs for each block | 6-24 | 6-24 | 6-24 | 6-24 |

In the case of 40 inch and 46 inch corresponding to the middle size, the number of LED modules and the number of LEDs for each block can be selected in the same range. In the case of 40 inch, the backlight unit may be constructed in such a manner that the LED module is divided into 4-14 blocks. In the case of 46 inch, the backlight unit may be constructed in such a manner that the LED module is divided into 5-15 blocks. If necessary, the number of modules and the number of LEDs for each block may be properly selected within the range shown in Table 2.

In the case of 52 inch and 57 inch corresponding to the large size, the number of blocks for each module may be selected in the range of 6-28, and the number of LEDs for each block may be selected in the range of 6-24. Preferably, in the case of 52 inch, the number of LED modules may be selected in the range of 6-12. In the case of 57 inch, the number of LED modules may be selected in the range of 6-20.

That is, the number of LED modules may be selected in the range of 2-28, and each of the modules may be composed of 1 to 28 blocks. Further, 2 to 240 LEDs may be arranged in each of the blocks.

In this embodiment, the number of LED modules, the number of blocks, and the number of LEDs are not limited thereto.

Each of the optical sheets 140 has a plurality of light transmission holes (not shown) corresponding to the respective LEDs 100, and serves to diffuse or reflect incident light in a predetermined direction such that light generated from the LEDs 110 can be functionally diffused or irradiated toward the display device.

The optical sheet 140 is formed to have the same size of one LED module 120 among the plurality of LED modules 120, and is individually attached to each of the LED modules 120.

Accordingly, the optical sheet 140 and the LED module 120 can be integrally formed, which makes it possible to reduce the size and thickness of the backlight unit 100.

It has been described in this embodiment that the sizes of the optical sheet 140 and the heat radiating pad 130 are equal to that of the LED module. Without being limited thereto, as illustrated in FIG. 2B, the sizes of the optical sheet 140 and the heat radiating pad 130 may be smaller than that of the LED module.

Since the optical sheet 140 is individually attached to each of the LED modules 120, only the optical sheet 140 attached to a damaged LED module 120 among the plurality of LED modules 120 is selectively removed so as to replace or repair the damaged LED module 120, which makes it possible to facilitate the subsequent process such as the rework process of the backlight unit 100.

The heat radiating pad 130 serves to radiate heat generated from the LED module 120 and may be formed of a heat radiating plate composed of synthetic resin or glass or a metal plate with high heat conductivity. If necessary, the heat radiating pad 130 on the bottom surface of the LED module 120 may be removed, in case where a small amount of heat is generated.

The optical sheet 140, the LED module 120, and the heat radiating pad 130 are integrally formed, thereby achieving a reduction in size and thickness of the backlight unit 100. Further, the optical sheet 140 is individually attached on each of the LED modules 120, which makes it possible to easily rework the backlight unit 100.

Further, the number of LED modules having optimal brightness and color uniformity, the number of blocks for each LED module, and the number of LEDs can be properly selected, which makes it possible to properly select the number of the optical sheets and the heat radiating pads.

In this embodiment, it has been described that the optical sheets 140 are separated for each block. Like the optical sheets 140, reflecting sheets may be separated for each block.

As shown in FIG. 2, the plurality of LEDs are arranged in one line on one LED module 120 among the plurality of LED modules 120. Without being limited thereto, however, the plurality of LEDs may be arranged in various shapes depending on the characteristic of the backlight unit.

Hereinafter, a variety of examples for the arrangement of the LEDs disposed in the LED module 120 will be described with reference the drawings.

Figure 3:
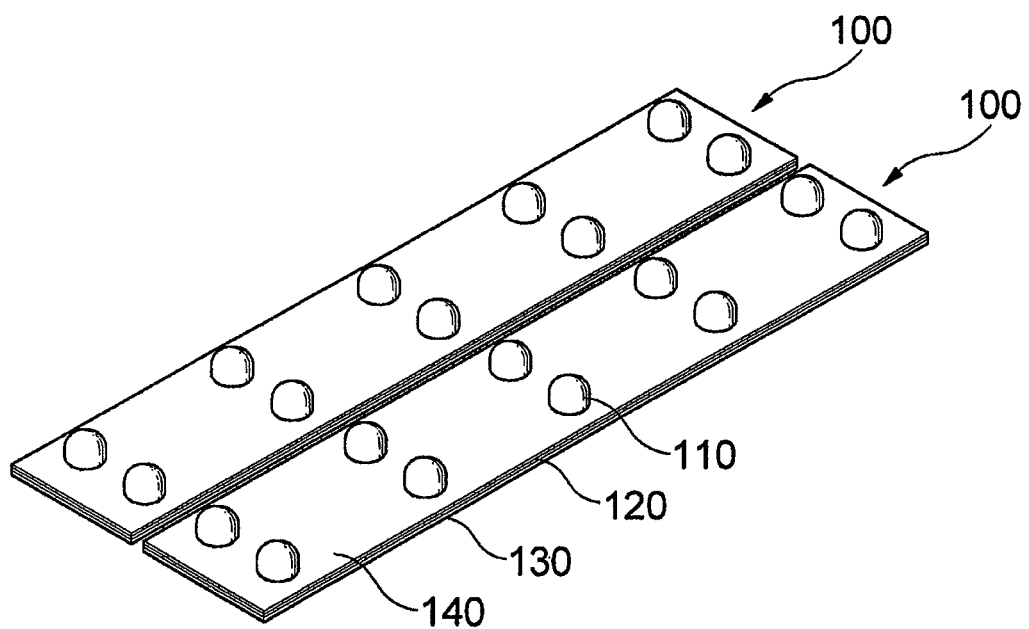
FIG. 3 is a perspective view showing the arrangement of a plurality of LEDs in a backlight unit according to a first embodiment of the invention.

FIG. 3 is a perspective view showing the arrangement of a plurality of LEDs in a backlight unit according to a first embodiment of the invention.

As shown in FIG. 3, the plurality of LEDs 110 may be arranged in two lines on one LED module 120. That is, the plurality of LEDs 110 may be arranged in one or more lines on one LED module 120 depending on the characteristic of the backlight unit.

Figure 4:
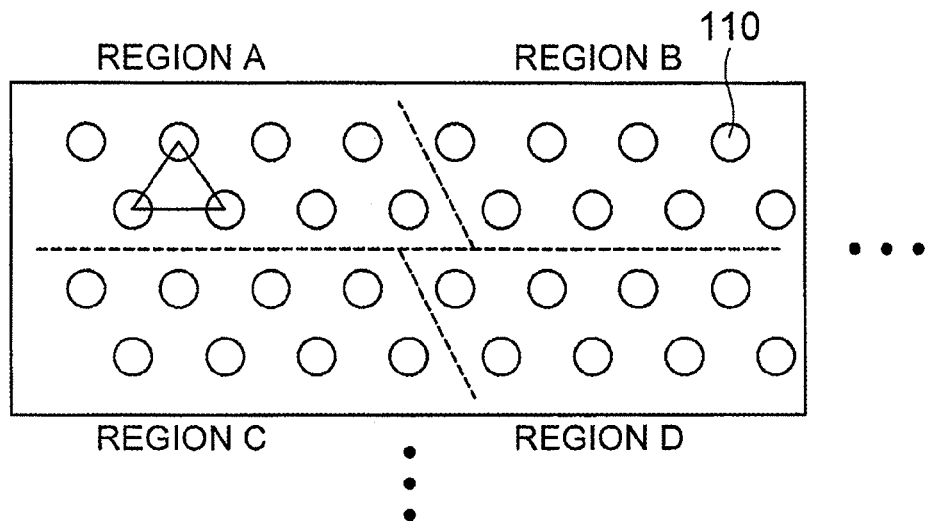
FIG. 4 is a plan view showing the arrangement of a plurality of blocks in a backlight unit according to a second embodiment of the invention.

FIG. 4 is a plan view showing the arrangement of a plurality of blocks in a backlight unit according to a second embodiment of the invention.

Figure 5:
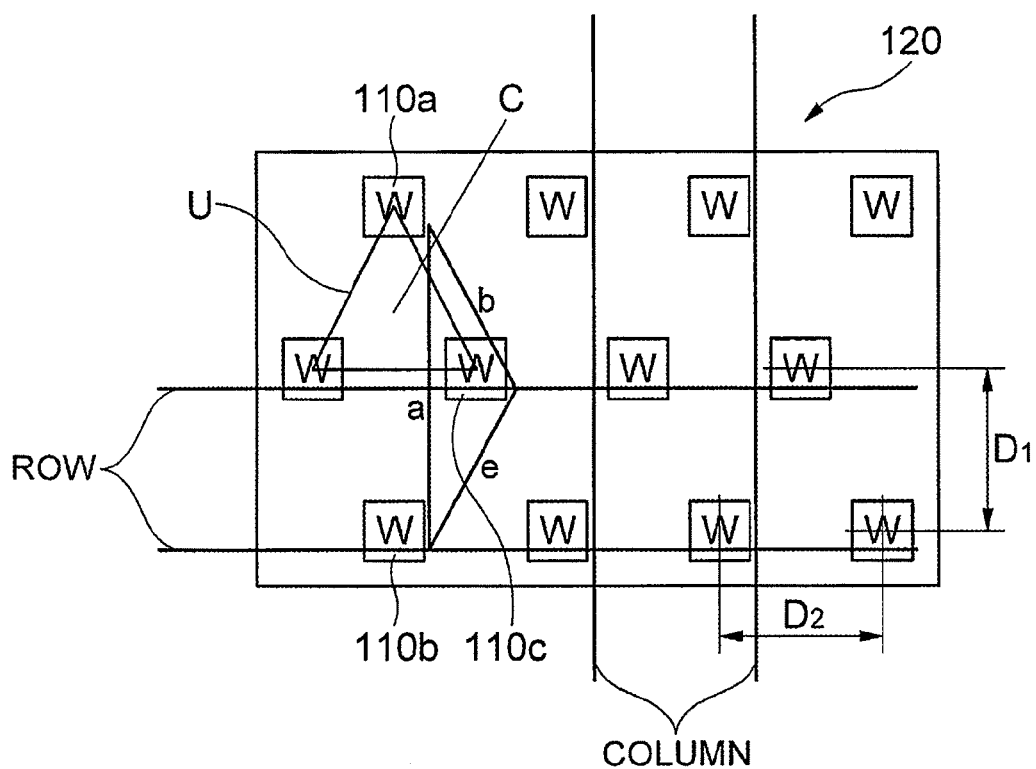
FIG. 5 is a plan view showing the arrangement of a plurality of LEDs in the backlight unit according to the second embodiment of the invention.

FIG. 5 is a plan view showing the arrangement of a plurality of LEDs in the backlight unit according to the second embodiment of the invention.

As shown in FIG. 4, a plurality of LEDs 110 may be continuously arranged on the LED module 120 so as to have a triangle shape. The plurality of LEDs 110 may be divided into a plurality of blocks A to D such that the backlight unit 100 is separately driven for each block. The respective blocks may be separated from each other so as to be independently turned on/off, and the LEDs disposed in each block are connected through printing circuit patterns. In this case, the heat radiating pad on the bottom surface of the LED module 120 may be omitted, if necessary, when a small amount of heat is generated.

By adjusting the arrangement of the LEDs, the backlight unit 100 can have optimal uniformity. As shown in FIG. 5, when the LEDs 110 implements white light, the LEDs 110 are separated from each other. In this case, the center luminous intensity C of an LED unit U composed of arbitrary LEDs, which are disposed at the shortest distance from each other, should correspond to 80 to 120% of the average of luminous intensities of the LEDs such that the backlight unit 100 has optimal uniformity.

At this time, a first distance (a) between first and second LEDs 110a and 110b, which are disposed in the same column and are adjacent to each other, may be set in the range of 20 to 140 mm. Further, second and third distances (b) and (e) between the first and second LEDs 110a and 110b and a third LED 110c which is adjacent to the first and second LEDs in the row direction may be set in the range of 15 to 90 mm. In this case, the second and third distances (b) and (e) may be equal to each other such that the backlight unit 100 has optimal uniformity. The first distance (a) should be larger than the second and third distances (b) and (e).

Further, the distance between the first and third LEDs 110a and 110c which are adjacent to each other in the column direction and the distance between the second and third LEDs 110b and 110c which are adjacent to each other in the row direction may be set in the range of 8.2 to 70 mm.

Figure 6:
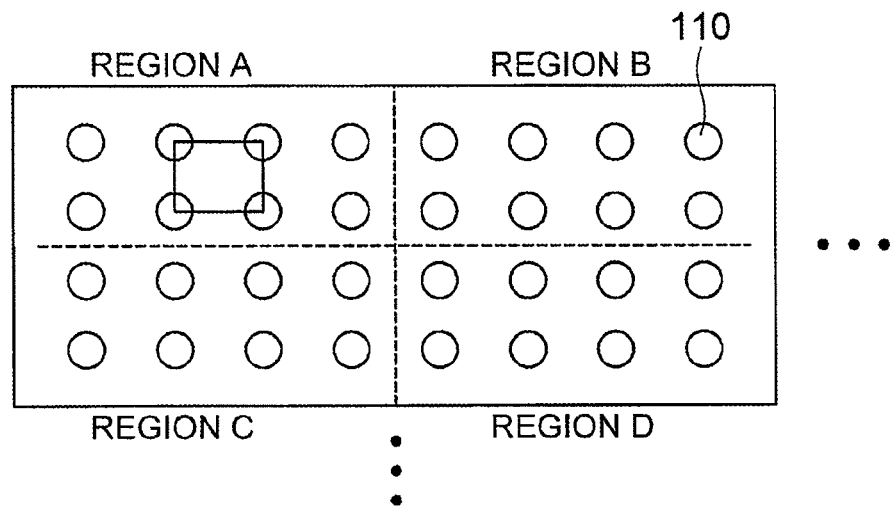
FIG. 6 is a plan view showing the arrangement of a plurality of blocks in a backlight unit according to a third embodiment of the invention.

FIG. 6 is a plan view showing the arrangement of a plurality of blocks in a backlight unit according to a third embodiment of the invention.

Figure 7:
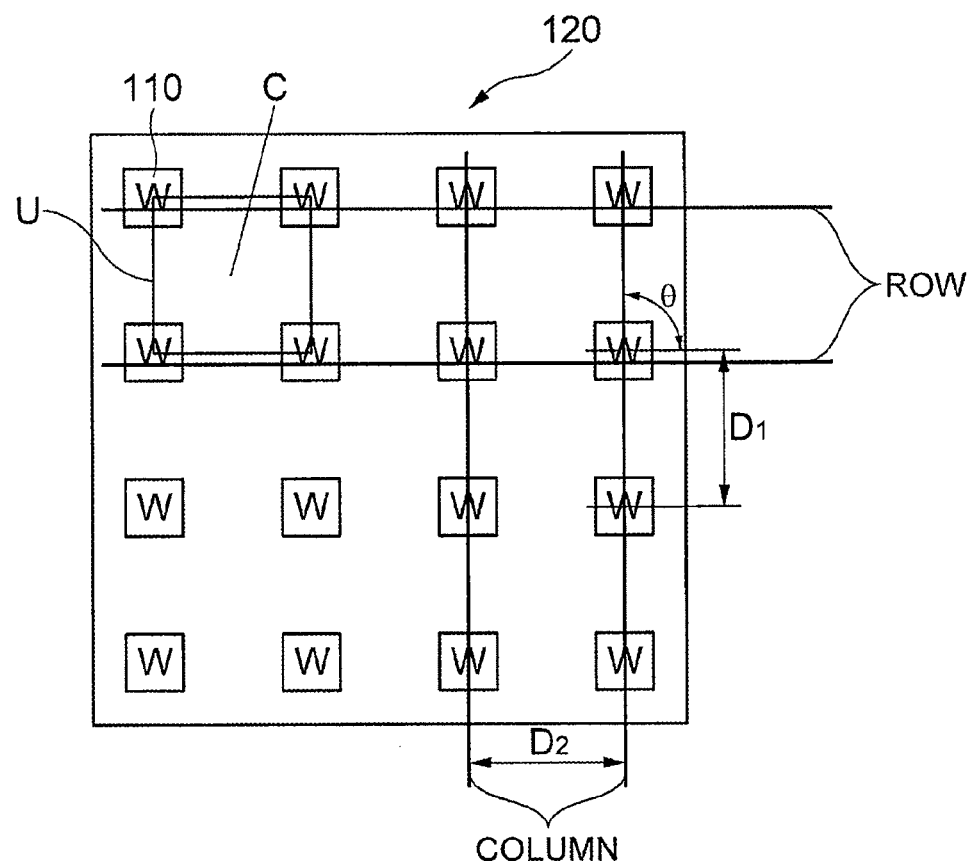
FIG. 7 is a plan view showing the arrangement of a plurality of LEDs in the backlight unit according to the third embodiment of the invention.

FIG. 7 is a plan view showing the arrangement of a plurality of LEDs in the backlight unit according to the third embodiment of the invention.

As shown in FIG. 6, the plurality of LEDs 110 on the LED module 120 may be continuously arranged in a square or rectangle, for example. The plurality of LEDs 110 may be divided into a plurality of blocks A to D such that the backlight unit is separately driven for each block. The respective blocks may be separated from each other so as to be independently turned on/off, and the LEDs disposed in each block are connected through printing circuit patterns. In this case, the heat radiating pad on the bottom surface of the LED module 120 may be omitted, if necessary, when a small amount of heat is generated.

As shown in FIG. 7, when the plurality of LEDs are arranged in a rectangle, the center luminous intensity C of an LED unit U composed of arbitrary LEDs, which are disposed at the shortest distance from each other, should correspond to 80 to 120% of the average of luminous intensities of the LEDs. For this construction, distances D1 and D2 between the adjacent LEDs 110 may be set in the range of 8.2 to 70 mm. Further, an angle between the column direction where the LEDs 110 are arranged and the position where the LED is disposed may be formed in the range of 70 to 110 degrees.

In such an LED arrangement, the LEDs should satisfy the following condition so as to enhance color reproducibility and brightness.

To implement white light, the LED chip may include a blue LED chip having a dominant wavelength of 420-456 nm; red phosphors which are disposed around the blue LED chip and are excited by the blue LED chip so as to emit red light; and green phosphors which are disposed around the blue LED and are excited by the blue LED chip so as to emit green light. In this case, the color coordinates of the red light emitted from the red phosphors should be positioned within a region surrounded by four vertexes of (0.6448, 0.4544), (0.8079, 0.2920), (0.6427, 0.2905) and (0.4794, 0.4633) on the basis of the CIE 1931 color coordinate system, and the color coordinates of the green light emitted from the green phosphors should be positioned within a region surrounded by four vertexes of (0.1270, 0.8037), (0.4117, 0.5861), (0.4197, 0.5316), and (0.2555, 0.5030).

Preferably, the FWHM (Full Width at Half-Maximum) of an emission spectrum of the blue LED chip ranges from 10 to 30 nm, the FWHM of the green phosphors ranges from 30 to 100 nm, and the FWHM of the red phosphors ranges from 50 to 200 nm. Accordingly, it is possible to obtain white light with more excellent color uniformity and quality. In particular, as the dominant wavelength and the FWHM of the blue LED chip are limited to 420-456 nm and 10-30 nm, respectively, it is possible to enhance the efficiency of $CaAlSiN_3$:Eu red phosphor and $(Sr, Ba, Ca, Mg)_2SiO_4$:Eu, X green phosphor (0≤sum of composition of Ba, Ca, Mg≤1).

As described above, as for a material used as the red phosphor, nitride-based $CaAlSiN_3$:Eu, sulfide-based $(Ca, Sr)S$:Eu and so on may be exemplified.

As for a material used as the green phosphor, silicate-based $A_2SiO_4$ having a composition of 2, 1, 4, silicate-based $A_3SiO_5$ having a composition of 3, 1, 5, sulfide-based $SrGa_2S_4$:Eu, and nitride-based Beta-SiAlON may be exemplified. As for the silicate-based phosphor having a composition of 2, 1, 4, $(Sr, Ba, Ca, Mg)_2SiO_4$:Eu, X may be used. In this case, Sr is an essential element, and Ba, Ca, and Mg may be selectively included ((0≤sum of composition of Ba, Ca, Mg≤1), if necessary. Eu is used as an activator, and Eu2+ is used. X is an additive and may include at least one or more of Ho, Er, Ce, Y, F, Cl, Br, I, P, S, N, and Gd. A doping amount of X may be adjusted in the range of 1 to 500000 ppm. Further, as for the silicate-based phosphor having a composition of 3, 1, 5, $(Sr, Ba, C, Mg)_3SiO_5$:Eu, X may be used. In this case, Sr is an essential element, and Ba, Ca, and Mg may be selectively included ((0≤sum of composition of Ba, Ca, Mg≤1), if necessary. Eu is used as an activator, and Eu2+ is used. X is an additive and may include at least one or more of Ho, Er, Ce, Y, F, Cl, Br, I, P, S, N, and Gd. A doping amount of X may be adjusted in the range of 1 to 500000 ppm.

As for a material used as the blue phosphor, a silicate-based material, a sulfide-based material, a nitride-based material, and an aluminate-based material may be exemplified.

Figure 8:
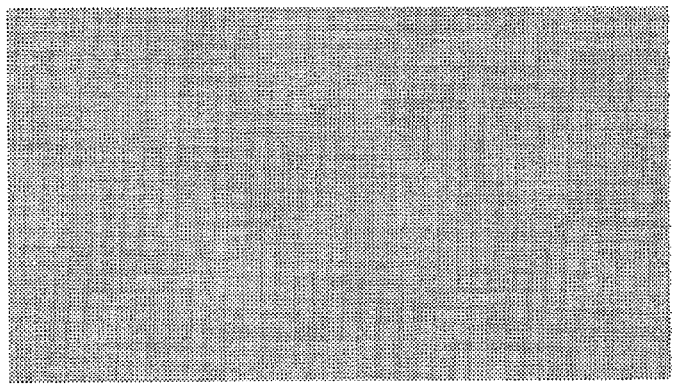
FIG. 8 is an image showing the brightness of the backlight unit according to the invention.

FIG. 8 is an image showing the brightness of the backlight unit according to the invention. As shown in FIG. 8, when the plurality of LEDs are arranged in such a manner that the center luminous intensity C of an LED unit U composed of arbitrary LEDs, which are disposed at the shortest distance from each other, corresponds to 80 to 120% of the average of luminous intensities of the LEDs, it can be found that the backlight unit has the optimal uniformity.

In the backlight unit in which the plurality of LED modules each having the plurality of LEDs are provided, the uniformity, color reproducibility, and brightness of the backlight unit can be enhanced by adjusting the shape and arrangement of the LEDs.

Hereinafter, referring to FIGS. 9 and 10, the backlight unit according to the invention will be described in more detail.

Figure 9:
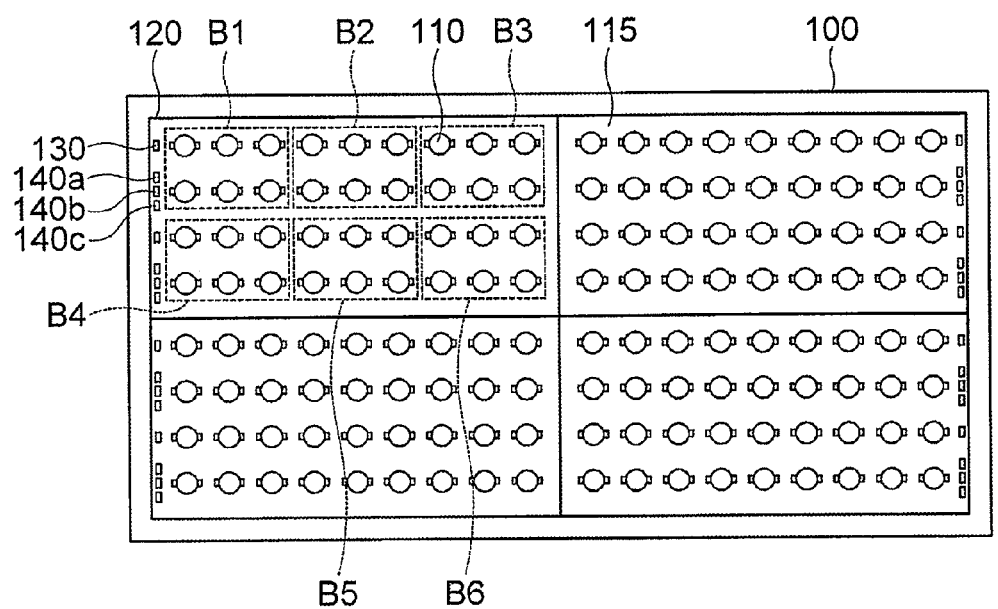
FIG. 9 is a plan view of the backlight unit according to the invention.

FIG. 9 is a plan view of the backlight unit according to the invention.

Figure 10:
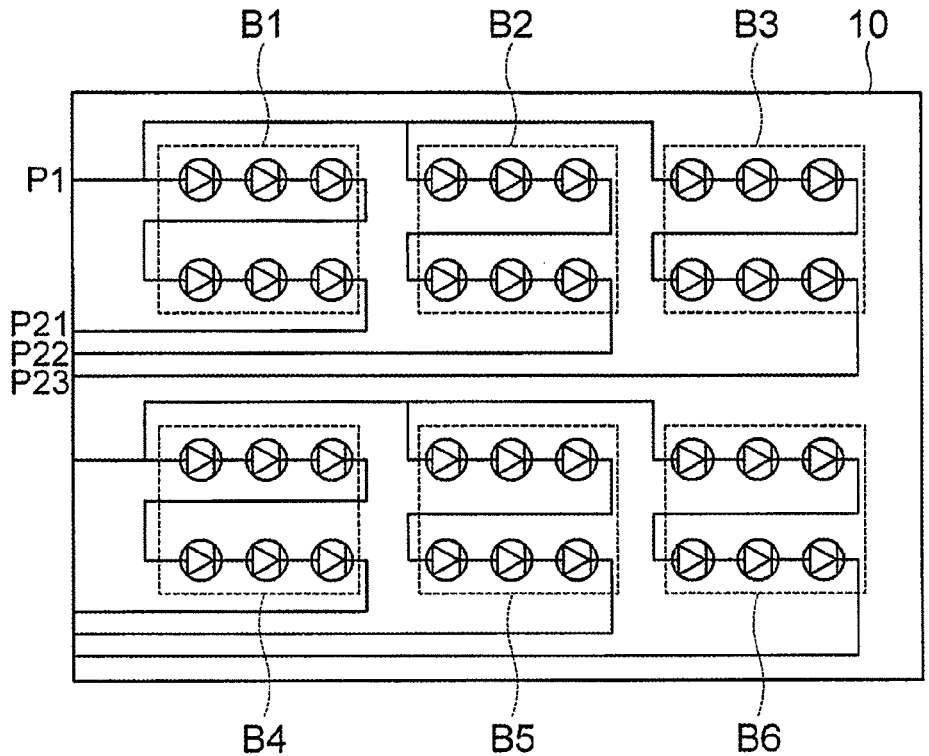
FIG. 10 is a circuit diagram of the backlight unit according to the invention.

FIG. 10 is a circuit diagram of the backlight unit according to the invention.

Referring to FIG. 9, the backlight unit 100 according to the invention may be a backlight unit which can be separately driven for each block. For example, the backlight unit 100 may include four LED modules 120. Each of the LED modules 120 includes a wiring board 115 and a plurality of LED chips 110 mounted on the wiring board 115. The LED chips 110 may be arranged in a matrix composed of 4 rows and 9 columns.

The LED module 120 may be divided into 6 blocks B1 to B6. In this embodiment, each of the blocks B1 to B6 composing the LED module 120 means a unit which can be separately driven.

The LED chips 110 within each of the blocks B1 to B6 may be connected in series to each other. At least one end of each of the blocks B1 to B6 is connected to a separate connector such that the LED chips 110 can be separately driven for each block. To implement the connection, the wiring board 115 of the LED module 120 includes two of first connectors 130 and six of second connectors 140a, 140b, and 140c. The first and second connectors 130, 140a, 140b, and 140c serve to provide an external voltage to the LED chips 110.

On each of the LED modules 120, an optical sheet (not shown) is individually attached. Therefore, when one LED module 120 among the plurality of LED modules 120 is damaged, only the optical sheet attached on the damaged LED module 120 can be removed so as to replace or repair the damaged LED module 120, which makes it possible to easily rework the backlight unit 100.

Referring to FIG. 10, each of the first to third blocks B1 to B3 is composed of six LED chips 110 which are disposed across three columns at the first and second rows, and each of the fourth to sixth blocks B4 to B6 is composed of six LED chips 110 which are disposed across three columns at the third and fourth rows.

The LED chips of each block are connected in series to each other. In the series circuit of the first to third blocks B1 to B3, positive terminals (+) are commonly connected to a first connector P1, and negative terminals (−) are connected to three of second connectors P21 to P23, respectively, for each block. Similarly, in the series circuit of the fourth to six blocks B4 to B6, positive terminals (+) are commonly connected to the first connector, and negative terminals are connected to three of second connectors, respectively, for each block. The connectors P1 and P21 to P23 of FIG. 9 may correspond to the first and second connectors shown in FIG. 8.

As such, the backlight unit according to the invention can implement a structure which is required for the division driving for each block and can adjust the number of LED chips by the unit of three LED chips.

In the backlight unit according to the invention, the LED chips are arranged in a matrix shape composed a plurality of rows and columns so as to uniformly illuminate light, and the number of LED chips which are required for an area can be properly adjusted by adjusting the number of LED modules, the number of blocks for each LED module, and the number of LED chips for each block. Therefore, a necessary number of LED chips can be easily arranged with proper density. As a result, it is possible to effectively improve a local dimming effect and entire color uniformity in middle- and large-sized displays.

Further, as described above, the optical sheet (not shown) is individually attached on each of the LED modules 120. Therefore, when one LED module 120 among the plurality of LED modules 120 is damaged, only the optical sheet attached on the damaged LED module 120 can be removed so as to replace or repair the damaged LED module 120, which makes it possible to easily rework the backlight unit 100.

In this embodiment, it has been described that the LED modules are arranged in the longitudinal direction thereof. However, the arrangement of the LED modules is not limited thereto.

Figure 11:
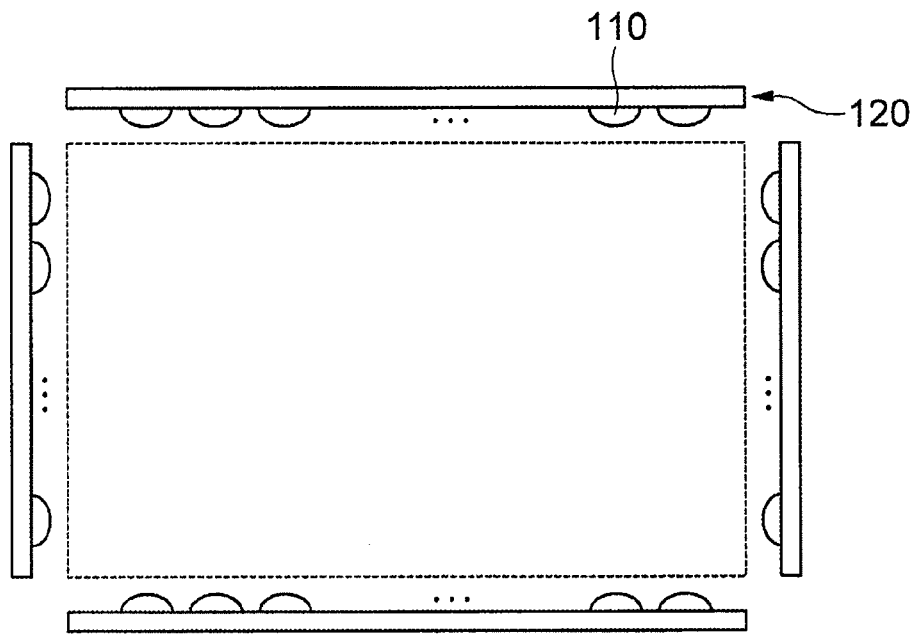
FIG. 11 is a perspective view showing another example for the arrangement of LED modules in the backlight unit according to the invention.

FIG. 11 is a perspective view showing another example for the arrangement of LED modules in the backlight unit according to the invention.

As shown in FIG. 11, the LED modules 120 may be arranged so as to surround a predetermined region. In FIG. 11, four LED modules are exemplified, but more than four LED modules are arranged so as to surround the region. The heat radiating pad on the bottom surface of the LED module maybe omitted, when a small amount of heat is generated.

According to the present invention, the LED module, the optical sheet positioned on the LED module, and the heat radiating pad positioned under the LED module are integrally formed, thereby reducing the size and thickness of the backlight unit.

Since the optical sheet is individually attached to each of the LED modules, only the optical sheet attached to a damaged LED module among the plurality of LED modules is selectively removed so as to replace or repair the damaged LED module, which makes it possible to facilitate the subsequent process such as the rework process.

Further, as the number of LED modules, the number of blocks for each LED module, and the number of LED for each block are set in consideration of color uniformity and brightness depending on the area of the backlight, it is possible to minimize the number of optical sheets or reflecting sheets.

Accordingly, it is possible to achieve a reduction in size and thickness of the backlight unit and to enhance a production yield of the backlight unit.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:
1. A lighting device comprising:
a plurality of light emitting diode (LED) chips that emit light;
a plurality of LED modules each having a printed circuit board (PCB) which supports and drives the plurality of LED chips projecting from top surfaces of the printed circuit board; and
an optical sheet that is attached to the to surface of each printed circuit board included in each of the plurality of LED modules, respectively, wherein each of the optical sheets have a same size as each of the printed circuit boards or a smaller size than each of the printed circuit boards, respectively,
wherein the plurality of LED chips are divided into a plurality of blocks which are separated from each other through printing circuit patterns in a circuit manner so as to be independently turned on/off, and
wherein the plurality of LED modules include a plurality of white LED chips, the plurality of white LED chips each include a blue LED, a red phosphor, and a green phosphor to emit white light, color coordinates of red light emitted from the red phosphor are positioned within a region surrounded by four vertexes of (0.6448, 0.4544), (0.8079, 0.2920), (0.6427, 0.2905) and (0.4794, 0.4633) on the basis of the CIE 1931 color coordinate system, and color coordinates of green light emitted from the green phosphor are positioned within a region surrounded by four vertexes of (0.1270, 0.8037), (0.4117, 0.5861), (0.4197, 0.5318), and (0.2555, 0.5030).

2. The lighting device of claim 1, wherein the plurality of LED chips are arranged in a matrix shape composed of two or more rows and two or more columns.

3. The lighting device of claim 1, wherein the plurality of LED chips in each of the plurality of blocks are connected to each other in series.

4. The lighting device of claim 1, wherein the plurality of LED chips include an LED unit composed of arbitrary LED chips which are disposed at the shortest distance from each other and a center luminous intensity of the LED unit corresponds to 80 to 120% of the average of luminous intensities of the LED chips.

5. The lighting device of claim 1, wherein the plurality of LED chips are continuously arranged in a triangle shape and a distance between first and second LED chips, which are disposed in the same column and are adjacent to each other, is set in the range of 20 to 140 mm.

6. The lighting device of claim 1, wherein the plurality of LED chips are continuously arranged in a rectangle shape and distances between LED chips, which are adjacent to each other, are set in the range of 8.2 to 70 mm.

7. The lighting device of claim 1, wherein the plurality of LED chips are continuously arranged in a rectangle shape and an angle between the column direction where the LED chips are arranged and a position where the LED is disposed is formed in the range of 70 to 110 degrees.

8. The lighting device of claim 1, wherein the red phosphor includes a nitride-based or sulfide-based phosphor.

9. The lighting device of claim 1, wherein the green phosphor includes any one of silicate-based, sulfide-based and nitride-based phosphors.

10. The lighting device of claim 1, wherein the plurality of LED modules are arranged outside of a predetermined region of a central part.

11. The lighting device of claim 1, wherein the lighting device is a backlight unit.

12. A display device comprising: a display panel; and
a backlight unit which irradiates light to the display panel, wherein the backlight unit comprises:
a plurality of LED chips that emit light;
a plurality of LED modules each having a printed circuit board (PCB) which supports and drives the plurality of LED chips projecting from top surfaces of the printed circuit board; and
an optical sheet that is attached to the to surface of each printed circuit board included in each of the plurality of LED modules, respectively, wherein each of the optical sheets have a same size as each of the printed circuit boards or a smaller size than each of the printed circuit boards, respectively,
wherein the plurality of LED chips are divided into a plurality of blocks which are separated from each other through printing circuit patterns in a circuit manner so as to be independently turned on/off, and
wherein the plurality of LED modules include a plurality of white LED chips, the plurality of white LED chips each include a blue LED, a red phosphor, and a green phosphor to emit white light, color coordinates of red light emitted from the red phosphor are positioned within a region surrounded by four vertexes of (0.6448, 0.4544), (0.8079, 0.2920), (0.6427, 0.2905) and (0.4794, 0.4633) on the basis of the CIE 1931 color coordinate system, and color coordinates of green light emitted from the green phosphor are positioned within a region surrounded by four vertexes of (0.1270, 0.8037), (0.4117, 0.5861), (0.4197, 0.5316), and (0.2555, 0.5030).

13. The display device of claim 12, wherein the plurality of LED chips are arranged in a matrix shape composed of two or more rows and two or more columns.

14. The display device of claim 12, wherein the plurality of LED modules are arranged outside of a predetermined region of a central part.

15. The lighting device of claim 1, further comprising a plurality of heat radiating pads that are attached to rear surfaces of the plurality of LED modules, respectively.

16. The display device of claim 12, wherein the backlight unit is an edge-type backlight unit.

* * * * *